United States Patent [19]

Dirmeyer et al.

[11] Patent Number: 4,700,157

[45] Date of Patent: Oct. 13, 1987

[54] CONNECTOR PLUG HAVING A RADIO FREQUENCY SUPPRESSION FILTER

[75] Inventors: Josef Dirmeyer, Bodenwoehr; Heinz Kathmann, Regensburg; Franz Merkle, Ottobrunn; Franz Oberberger, Moetzing; Walter Wilhelm, Wenzenbach; Josef Wimmer, Regenstauf, all of Fed. Rep. of Germany

[73] Assignee: Siemens Aktiengesellschaft, Berlin and Munich, Fed. Rep. of Germany

[21] Appl. No.: 762,443

[22] Filed: Aug. 5, 1985

[30] Foreign Application Priority Data

Sep. 4, 1984 [DE] Fed. Rep. of Germany ....... 3432491

[51] Int. Cl.⁴ .............................................. H03H 7/01
[52] U.S. Cl. ..................................... 333/185; 333/12; 333/181
[58] Field of Search ................ 333/167, 177, 181–185, 333/12; 339/147 R, 147 C; 361/331, 332, 397, 399, 400, 415, 424; 174/50, 50.52, 51, 52 R, 52 FB, 65 R, 68.5

[56] References Cited

U.S. PATENT DOCUMENTS

| | | | |
|---|---|---|---|
| 2,939,095 | 5/1960 | Chertok | 333/167 |
| 3,374,447 | 3/1968 | Stilwell | 333/167 |
| 4,408,171 | 10/1983 | Akino et al. | 333/181 X |
| 4,563,659 | 1/1986 | Sakamoto | 333/181 |

OTHER PUBLICATIONS

"Standard for Safety-Electromagnetic Interference Filters", UL 1283, Underwriters Laborotories Inc., L.I., N.Y., Mar. 26, 1984, pp. 1–34 and A1.

Primary Examiner—Marvin L. Nussbaum
Attorney, Agent, or Firm—Hill, Van Santen, Steadman & Simpson

[57] ABSTRACT

A connector plug has an electrical radio frequency suppression filter comprising a metallic filter housing partially slipped onto the plug, the filter having electrical filter components, particularly inductances and capacitances, disposed within the filter housing, embedded in a casting compound, partially connected to the device plug leads at the power supply side and partially connected to the leads facing the device to be energized, whereby the device-side leads, particularly tabs, extend out of the open end face of the filter housing facing away from the plug and a broad surface protective conductor is connected to the filter housing in an electrically conductive manner. The protective conductor is preferably designed as a cross-shaped protective conductor within the filter housing and whose one ends are connected to terminals of Y-capacitors. The cross-shaped protective conductor and the electrical filter components are thereby located at opposite sides of an insulating lamina.

8 Claims, 4 Drawing Figures

CONNECTOR PLUG HAVING A RADIO FREQUENCY SUPPRESSION FILTER

CROSS REFERENCE TO RELATED APPLICATION

This application is relates to application Ser. No. 762,509 filed Aug. 5, 1985.

BACKGROUND OF THE INVENTION

1. Field of the Invention

The present invention relates to a connector plug having a following electrical radio frequency (RF) suppression filter comprising a metallic filter housing partially disposed onto the plug with electrical filter components, particularly inductances and capacitances, which are disposed within a filter housing, are embedded in a casting compound, are partially connected to the connector plug terminals at the power supply side and partially connected to the terminals facing the device to be energized, whereby the device-side terminals, particularly tabs, pigtails, pin plugs and the like, are conducted out at a partially open front end of the filter housing facing away from the connector plug and a protective connector extends over the full length of the RF suppression filter and is electrically connected to the filter housing.

2. Description of the Prior Art

Among other things, the RF suppression filters of the type generally set forth above are intended for use in desk-top computers, office machines and medical apparatus. The essential job of such a plug is to reduce the line-bound noise level. Since, due to their type of utilization, these filters are exposed in the environment of their use to high electrical and magnetic field strength levels, it must be provided that their noise suppression effect is not reduced by electrical and magnetic in-coupling onto the wiring or, respectively, the components of the filter circuit. These problems occur to a high degree particularly given their use in electrical devices having switched power supplies and/or in microprocessor systems having long bus lines. Insofar as attempts have already been made to resolve these problems, these are comprised, for example, in the utilization of metal housings for the RS suppression filters which are closed on all sides and which comprise insulated grommets for the leads. Deep-drawn housings of German silver or bipartite, tightly soldered housings of sheet iron thereby serve as metal housings.

Such filters have been disclosed, for example, as filters having an integrated rubber connector in which the leads extending from the commercial power supply side are carried out by way of this rubber connector, generally a socalled jack, and the contacting to the device which is provided with the filter is carried out by way of tabs, pigtails, solder lugs or the like. In this regard, see, for example, the technical information from the Components Division of Siemens AG, published by Siemens AG under the title "Elektromagnetische Verträglichkeit durch den Einsatz von Entstörfiltern", order number B/2418, particularly Page 18 and the Siemens advertising brochure "Funk-Entstörfilter", delivery program 1980/81, pp. 12-13, obtainable under the order number B/2284.

The leads and carriers of the electrical components are thereby tightly glued in a half shell of German silver sheet. The electrical components in and of themselves in this RS suppression filter are mounted in the half shell, are isolated and soldered in manually. Proceeding from the opening side of the half shell, the electrical components are subsequently first fixed with a soft epoxy resin casting compound and are subsequently mechanically protected by a hard casting compound.

Instead of the German silver half shell, other commercially available RF suppression filters employ a deepdrawn German silver housing. The components are mounted in an auxiliary frame with flat plugs and soldered. The casting of the components and of the tab plug parts located in the filter housing occurs through a hole in the German silver housing which must be tightly connected to plug and frame by incorporating sealing rings. The casting hole is covered by a glued on type plate.

Other RF suppression filters commercially available utilize a soldered jacket tube of thin plate, whereby the electrical components are mounted on a carrier plate which is subsequently riveted to the plug. The soldering of the ground wire occurs through a hole in the jack tube which must be previously slipped onto the plug. The solder locations is covered by a type plate. The casting of the electronic components thereby occurs proceeding from the open rear side of the jacket tube.

Finally, RF suppression filters are known, for example, from the Siemens data book 1982/1984 "EMV Funk-Entstorung-Bauelemente, Filter", Page 240, which are distinguished by an effective magnetic shielding and good radio frequency properties, can be manufactured with relatively low expense and meet the national and international regulations for these filters. These filters have a filter housing comprising inductances and capacitances integrated into the housing and embedded in casting compound, and comprise electrical leads, particularly tabs, pigtails, pin plugs and the like, which extend out at open end fages of the filter housing and are connected to the electrical components. The filter housing is thereby lengthened such that the terminal elements facing outward of at least one lead are disposed shielded within the filter housing. For this purpose, the filter housing can, for example, be tapered shaft-like at its open end faces.

Although the manufacture of these filters is already possible with relatively little expense, it nonetheless requires manual activities, therefore, in part, solderings and involved winding operations which can only be manually executed.

SUMMARY OF THE INVENTION

It is therefore the object of the present invention to provide a connector plug, particularly an IEC plug, having an RF suppression filter in accordance with the species initially set forth which, upon retention of good RF shielding properties inherent in the last-mentioned, known RF suppression filters, as well as upon fulfillment of the corresponding national and international regulations, may be manufactured in an extremely cost-effective manner, i.e. in a way involving particularly little expense.

According to the present invention, the above object is achieved in a connector plug having an electrical RS suppression filter comprising a metallic filter housing partially slipped onto the plug and having electrical filter components, particularly inductances and capacitances, which are disposed within the filter housing, are embedded in a casting compound, are partially connected to the terminals facing the device side, where the device-side terminals, particularly tabs, pigtails, pin plugs and the like, are conducted out at the partially open front end of the filter housing facing away from the plug and a protective conductor extends over the full length of the RF suppression filter and is electrically connected to the filter housing, and specifically provides that the protective cover is shaped so as to have a broad area preferably as a cross-shaped protective conductor part within the filter housing whose one ends, i.e. those ends particularly extending perpendicular to the longitudinal direction of the protective conductor are connected to the terminals of Y-capacitors and that the protective conductor part is separated from the electrical filter components by an insulator lamina and which additionally preferably serves as a carrier of this lamina.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
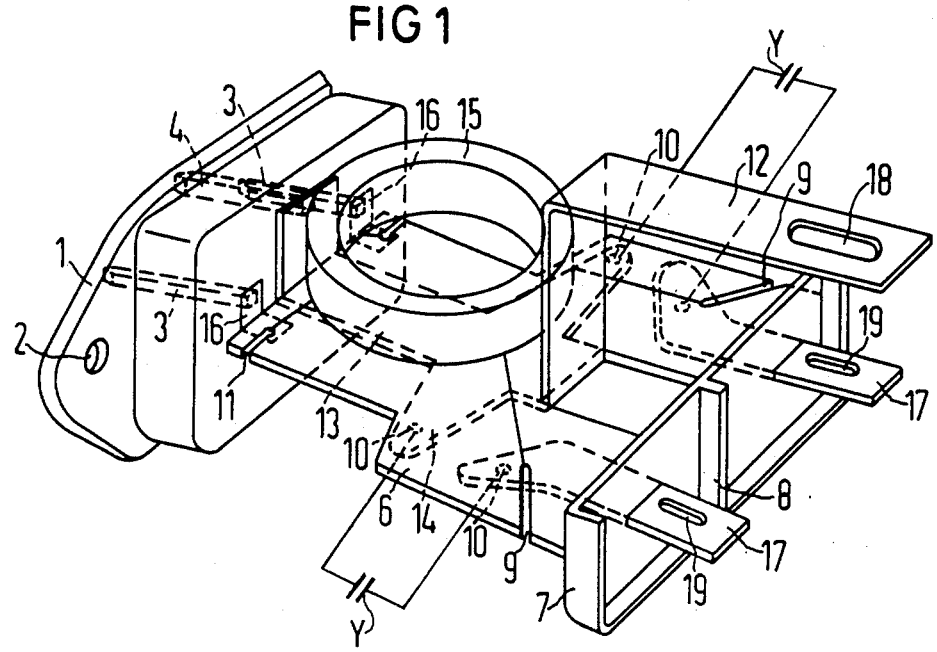
FIG. 1 is a perspective view of a first exemplary embodiment of the invention of a connector plug having an RF suppression filter, whereby, for the purpose of illustration, the capacitor filter component, the casting of the arrangement and the filter housing are not shown.

Referring to FIG. 1, a plug 1, particularly an IEC plug, is illustrated as comprising lateral shackles having bores 2. This generally known plug structure encompasses pin-like electrical terminal elements 3 together with a protective conductor 4 embedded in the rear part of the plug. The plug 1 is followed by an electrical RF suppression filter of whose electrical filter components only a toroidal core inductor 15 is schematically shown for the purpose of an improved illustration. The RF suppression filter is additionally equipped with one X-capacitor and with two Y-capacitors of which only their contacts to the leads are set forth below.

Figure 3:
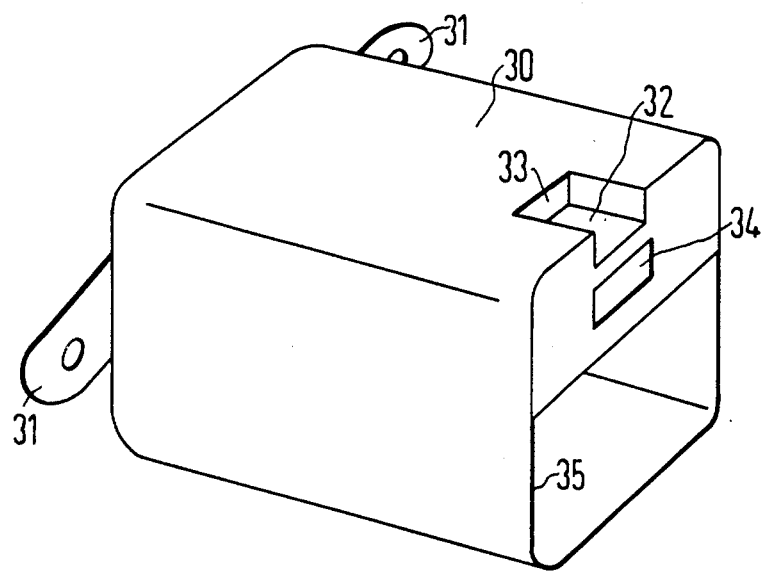
FIG. 3 is a perspective view of a filter housing for the exemplary -embodiments of FIGS. 1 and 2.

An insulating lamina 6 has the electrical filter components disposed on one side thereof and a broad-area protective conductor, shaped in this region as a cross-shaped protective conductor, is provided and referenced 13. The one angled end of the protective conductor 13 presses against the rear wall of the plug and is thereby compacted to the end face of the protective conductor 4 which extends through the rear wall of the plug. The end of the protective conductor 13 lying opposite thereto is likewise angled off and extends through a slot 33 in the filter housing (FIG. 3) in the condition when the filter housing 30 is slipped onto the plug 1. The filter housing 30, in its plugged condition, has its shackles 31 equipped with bores lying with the bores 2 with the shackle 31 pressing against the corresponding shackle of the plug 1 and is screwed thereto by way of screws extending through the bores, and also comprises a groove 32 in the region of the slot 33 for receiving a portion 12 of the protective conductor which partially rests on the groove 32. In the completely assembled condition of the overall arrangement, the protective conductor is galvanically connected to the filter housing 30 in the region of the groove 12 by way of ultrasonic welding.

In addition, angled-shaped terminal elements 13 have their one legs resting against the side of the protective conductor 13 and their other legs contacted to the end faces of the electrical lead 3 which extend through the rear of the plug. Further electrical leads 17 are disposed at the load side, i.e. at that side of the insulator lamina 6 facing away from the plug 1. At the side of the protective conductor 13, these leads partially lie on the insulating lamina 6 and are partially conducted through an insulating front plate 7 applied to the insulating lamina 6. A web 8 integral with the front plate 7 between the terminals 17 additionally guarantees the observation of the required insulating distances between the terminals 17. For contacting to, for example, wires, the terminals 17 and the portion 12 of the protective cover 13 are additionally fashioned with oblong holes 19 or, respectively, 18.

For facilitated contacting of the terminals of the plug side or, respectively, power supply side and at the device side of the protective conductor to the electrical filter components, the corresponding portions of the terminals 16, 17, the ends of the cross-shaped protective conductor 13 and the insulating lamina 6 are equipped in part with bores 10 and in part with slots 9, 11 open toward the edge which can be expanded to form bores at their closed ends. The introduction of the preferably wire-shaped leads of the windings (not shown on the drawing) of the toroidal core inductor 15 and of the X-capacitors and Y-capacitors (likewise not shown) is facilitated by a funnel-shaped design of the bores 10. In the completely assembled condition of the electrical filter components, the leads of the windings of the toroidal core inductor 15 extend by way of the slots 9 or, respectively, 11 to the terminals 17 or, respectively, to the elements 16, the X-capacitor has its leads plugged into the ends of the slots 11 expanded to form bores and the Y capacitors are connected by way of the bores 10 of the terminals 17 to the bores 10 of the protective conductor 13. The contacting can thereby be accomplished in a single work step by immersion soldering.

Given an emplaced filter housing 30, which is preferably drawn of aluminum, the free ends of the terminals 17 extend through the opening 35 in the filter housing and the entire interior of the filter housing is embedded in a casting compound which is supplied through a casting opening 34.

The above arrangement comprises a connector plug having an RF suppression filter which is distinguished by its small dimensions and by its simple manufacture.

Figure 2:
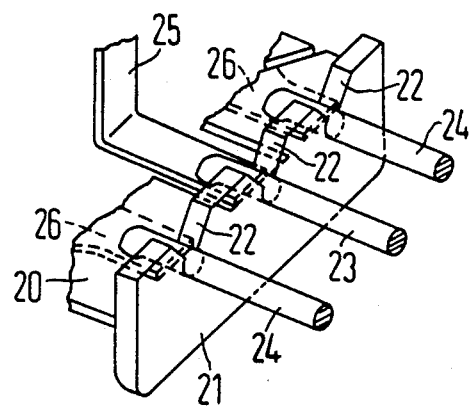
FIG. 2 is a fragmentary view of an embodiment of the invention differing from that of FIG. 1 only in terms of the portion at the device side, for which reason only this portion is shown in a fragmentary perspective view.

Instead of the tab connectors and protective conductors 17 or, respectively, 18 of FIG. 1, pin plugs and the pigtails 23, 24 illustrated in FIG. 2 are also possible, these being directly contacted to a protective conductor 25 or, respectively, to terminals 26, being contacted thereto, for example, by immersion soldering. The front panel 7 of FIG. 1 is thereby replaced by a front panel 21 which is preferably applied of a single piece to an insulating lamina 20 corresponding to the insulating lamina 6 and comprises notches 22 for receiving the pigtails 23, 24.

Figure 4:
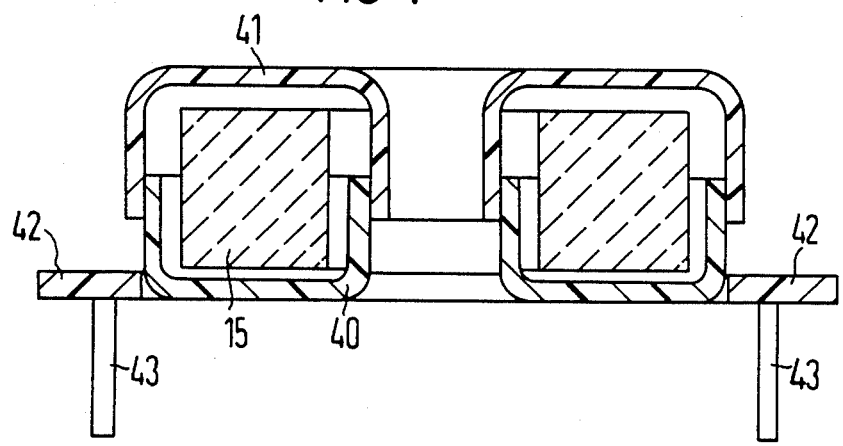
FIG. 4 is a sectional view of a toroidal core conductor intended as a filter component and inserted in an insulating container.

FIG. 4 shows an extremely simple structure for separate winding of the toroidal core 15 which is subsequently plugged onto the insulating plate 6 or, respectively, 20 and is electrically contactable to the corresponding leads by immersion soldering. The engagement of the winding ends into the slots 9, 11 necessary in the embodiment of FIG. 1 is consequently eliminated. The already wound toroidal ring inductor 15 is thereby inserted into an insulating vessel composed of two annular shell halves 40, 41 plugged into one another. Shackles 42 having electrical conductor pins 43 are applied to the lower shell half 40, the winding ends in the final winding operation being wound onto these connector pins 43. The aforementioned engagement of the winding ends into the slots is consequently eliminated.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. In a connector plug of the type having load terminals which extend via electrical conductors through a metallic filter housing to power supply terminals including a protective conductor electrically connected to the metallic filter housing, and in which filter components include capacitors which are disposed in the housing and have leads interconnected with the electrical conductors to form a radio frequency filter, the improvement wherein:

an insulating lamina is provided and divides the housing into first and second parts with the filter components located in the first part and includes openings for receiving the leads therethrough;

a pair of capacitors; and the protective conductor is a ground conductor located in the second part and comprises a wide area for electrically contacting selected ones of the leads via respective capacitors.

2. The improved connector plug of claim 1, wherein: the protective conductor comprises a cross-shaped member.

3. The improved conductor plug of claim 1, wherein: the insulating lamina is carried by the protective conductor.

4. The improved conductor plug of claim 1, wherein: the load terminals are carried by the insulating lamina.

5. The improved conductor plug of claim 1, wherein: the openings in the insulating lamina comprise slots opening towards respective edges of the lamina.

6. The improved conductor plug of claim 1, wherein: one of the electrical filter components comprises a toroidal core inductor, an insulating container including two shell insulating halves housing said inductor, shackles on one of said halves, connector pins mounted on said shackles and electrically connected to the leads of the inductor, said pins being pluggable through respective ones of the lamina openings.

7. The improved conductor plug of claim 1, wherein: one of the electrical filter components comprises a toroidal core inductor, an insulating container including first and second shell insulating halves housing said inductor, said second shell half integrally formed with said insulating lamina and comprising connector pins electrically connected to the leads of said inductor.

8. The improved conductor plug of claim 1, wherein: the electrical connection of the protective conductor to the metallic housing is located at the load terminal side of the housing.

* * * * *